United States Patent [19]
McKinney

[11] Patent Number: 5,389,843
[45] Date of Patent: Feb. 14, 1995

[54] SIMPLIFIED STRUCTURE FOR PROGRAMMABLE DELAYS

[75] Inventor: David J. McKinney, Beaverton, Oreg.

[73] Assignee: Tektronix, Inc., Wilsonville, Oreg.

[21] Appl. No.: 936,819

[22] Filed: Aug. 28, 1992

[51] Int. Cl.$^6$ .................... H03K 5/06; H03K 17/28
[52] U.S. Cl. ................................ 327/276; 327/261
[58] Field of Search ...................... 307/602, 603, 606

[56] References Cited

U.S. PATENT DOCUMENTS

| | | | |
|---|---|---|---|
| 3,634,772 | 1/1972 | Katz | 328/138 |
| 3,862,406 | 1/1975 | Brooks | 235/152 |
| 4,016,511 | 4/1977 | Ramsey et al. | 333/29 |
| 4,330,750 | 5/1982 | Mayor | 328/55 |
| 4,458,165 | 7/1984 | Jackson | 307/603 X |
| 4,626,716 | 12/1986 | Yasuhiko | 307/590 |
| 4,675,562 | 6/1987 | Herlein et al. | 307/602 |
| 4,714,924 | 12/1987 | Ketzler | 340/825.21 |
| 4,820,944 | 4/1989 | Herlein et al. | 307/603 |
| 4,894,626 | 1/1990 | Kubinec | 333/101 |
| 5,013,944 | 5/1991 | Fischer et al. | 307/603 |
| 5,055,706 | 10/1991 | Nakai et al. | 307/603 X |
| 5,128,555 | 7/1992 | Millman | 307/606 X |

FOREIGN PATENT DOCUMENTS 54-162945 12/1979 Japan.

*Primary Examiner*—Willis R. Wolfe
*Attorney, Agent, or Firm*—Boulden G. Griffith

[57] ABSTRACT

A programmable delay circuit with a simplified structure conserves parts and provides for simplified programmability. In this structure, N delay stages (1—N) each include delay elements (10,26,...,80) that produce delay times that are related as powers of two and are connected by two-input multiplexers (12,22,...,82). The two-input multiplexers select between the input and output of the delay element in their stage, and are collectively controlled by N-bits of delay selection signals that are connected so that less significant bits control multiplexers associated with delay elements producing shorter delays and more significant bits control multiplexers associated with delay elements producing longer delays in a monotonic correspondence. The resulting structure conserves parts and produces an overall delay time that is directly proportional to the binary value used to control the multiplexers. Alternative embodiments are disclosed in which delay elements are related as powers of an arbitrary base number Y instead of two, but this embodiment does not provide all possible delay values and the delay provided is not proportional to the value of the binary bits used for control.

2 Claims, 1 Drawing Sheet

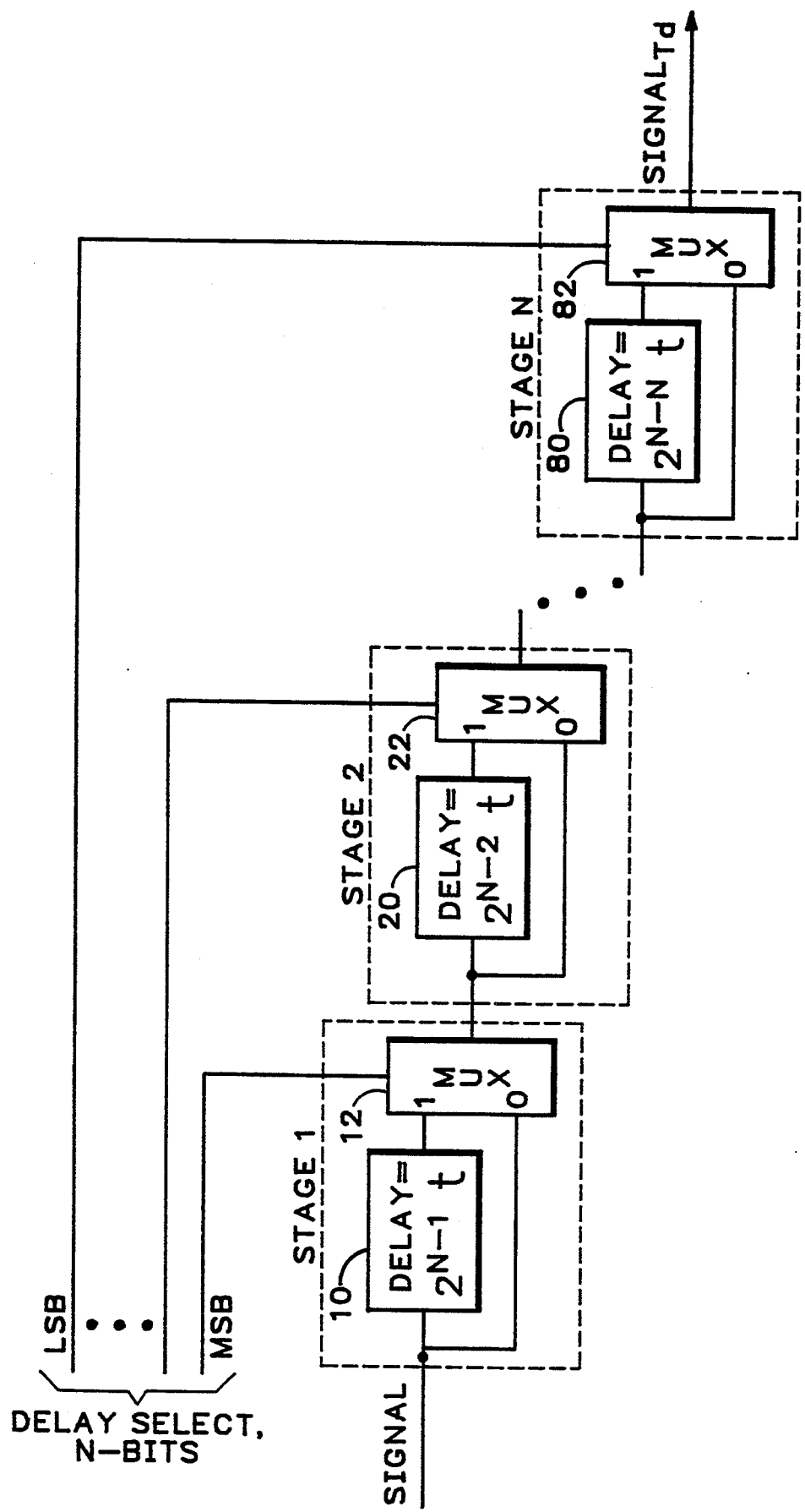

SIMPLIFIED STRUCTURE FOR PROGRAMMABLE DELAYS

FIELD OF THE INVENTION

This invention relates to variable length delay circuits for use in electronic design, and more particularly to programmable variable length delay circuits having a simplified structure to conserve parts and to provide ease of programmability.

BACKGROUND OF THE INVENTION

In electronic design, there is a recurring need for variable length delay circuits whose delay value is programmable during circuit operation.

U.S. Pat. No. 4,016,511 to Ramsey et al. for a "Programmable Variable Length High Speed Digital Delay Line", hereby incorporated by reference, discloses a delay line apparatus that utilizes a set of progressively increasing delay stages in conjunction with a set of digitally selectable switching units. The progressively increasing delay element stages have delay times that are related as powers of two, i.e., $1, 2, 4, \ldots, 2^{N-2}, 2^{N-1}$. These N delay element stages are arranged in series, connected by N switches that allow the input of any element to be connected to the output of any preceding element or the input to the overall delay line. Each switch must have as many positions as the number of delay element stages in front of it plus one. Thus, for N delay element stages, N switches are required, with those switches having $2, 3, \ldots N, N+1$ inputs, respectively. While these switches permit any combination of delay elements to be connected in series, to control them an N-bit delay length word must be decoded into numerous control lines in order to appropriately control each of the multi-input switches.

It would be highly desirable to have a programmable variable delay element with a simplified structure that both conserves parts and provides for simplified programmability.

SUMMARY OF THE INVENTION

In accordance with the present invention there is provided a programmable delay circuit with a simplified structure that both conserves parts and provides for simplified programmability. In this structure, N delay stages produce delays that have delay times that are related as powers of two, as in the patent to Ramsey et al., but in the present invention these delay elements are connected by two-input multiplexers, rather than by multi-input selectors. These two-input multiplexers select between the input and output of the delay element in their stage, and are collectively controlled by N-bits of delay selection signals that are connected so that less significant bits control multiplexers associated with delay elements producing shorter delays and more significant bits control multiplexers associated with delay elements producing longer delays in a monotonic correspondence. The resulting structure conserves parts and produces a delay time that is directly proportional to the binary value used to control the multiplexers.

BRIEF DESCRIPTION OF THE DRAWINGS

The drawing FIGURE is a block diagram showing the structure of the present invention and how it is controlled by delay selection signals.

DETAILED DESCRIPTION OF THE INVENTION

Referring to the FIGURE, a SIGNAL to be delayed is applied to the input of a first stage, STAGE 1. STAGE 1 includes a delay element 10 and a multiplexer 12. Delay element 10 provides a delay equal to $2^{N-1}t$, where N is the number of stages in the overall programmable variable delay circuit and t is the delay produced by the delay element of the stage with the shortest delay. The multiplexer 12 selects between the output of the delay element 10 on its "1" input and the input to delay element 10 on its "0" input. The selection made by multiplexer 12 is determined by the most significant bit of N-bits of DELAY SELECT signals.

The output of STAGE 1 is applied to the input of STAGE 2, which has a delay element 20 and a multiplexer 22 that are arranged in the same way that the corresponding circuit elements were arranged in STAGE 1. The delay element 20 produces a delay equal to $2^{N-2}t$, or one half of the delay provided by the delay element 10 of the preceding stage. The multiplexer 22 in this stage is controlled by the second most significant bit of the N-bits of DELAY SELECT signals.

Successive stages of the programmable variable delay circuit of the present invention are identical to those already described, except that each succeeding delay element has a delay value that is one half of that of the preceding one and each multiplexer is controlled by a progressively less significant bit of the DELAY SELECT signals. This pattern is repeated until the final stage, STAGE N, is reached. STAGE N has a delay element that is simply t (since $2^{N-N}=2^0=1$), and its multiplexer is controlled by the least significant bit of the DELAY SELECT signals. The output of STAGE N is $SIGNAL_{Td}$, where Td is the delay time of the overall programmable variable delay circuit.

Since the power of two relationship between the N bits of DELAY SELECT signal is mirrored by the power of two relationship between the delays of the N stages of this delay circuit, the total delay produced, Td, is directly proportional to the digital value on the DELAY SELECT signal lines. And, as long as this relationship is preserved, it does not matter what order the different stages are physically connected in; e.g., reverse order would work equally well, if the relationship between bit significance and stage delay time were preserved.

The delay elements $10, 20, \ldots, 80$ may be realized by replication of any means for achieving a fixed delay, e.g., registers, amplifiers, etc. The only requirement is that the resulting delays must have the power of two relationship to each other and the minimum delay element.

While the foregoing description has described an embodiment based on powers of two, the invention is not necessarily limited to that assuption. Alternative embodiments can be envisioned in which the delays associated with each stage are related as powers of a number other than two, e.g. ten or some other number Y. In this more general embodiment, each successive delay is Y times larger or smaller than the succeeding one; i.e., $1, Y, Y^2, \ldots Y^{N-2}, Y^{N-1}$, to provide a total delay that is the sum of any set of these values. This embodiment does not, however, provide sums representing all possible delay values nor does it provide direct proportionality between the binary control bit values and the delay selected.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true scope and spirit of the invention.

I claim:

1. A programmable variable delay circuit comprising a plurality (1−N) of delay stages connected in series, with each delay stage comprising:

a delay element (10,20, . . . ,80) having an input and an output, with the delay element associated with each different delay stage providing a characteristic delay time that is an integral power of a base number Y of a unit characteristic delay time t of a shortest delay element, with each delay stage producing a different delay and the delays associated with the plurality of delay stages including delays corresponding to t times each integral power of Y from 0 to N−1; and selecting means (12,22, . . . ,82) having two inputs, for selecting as an output of a particular stage either the input or the output of that stage's delay element;

and the programmable variable delay circuit further comprising N-bits of delay selection signals, with the delay selection signals being connected to the selecting means of the plurality of delay stages such that less significant bits are connected to selection means associated with shorter delays and more significant bits are connected to selection means associated with longer delays in a monotonic correspondence, so that digital values applied to the delay selection signals produce proportional cumulative delays from the variable delay circuit.

2. A programmable variable delay circuit comprising a plurality (1−N) of delay stages connected in series, with each delay stage comprising:

a delay element (10,20, . . . ,80) having an input and an output, with the delay element associated with each different delay stage providing a characteristic delay time that is an integral power of two of a unit characteristic delay time t of a shortest delay element, with each delay stage producing a different delay and the delays associated with the plurality of delay stages including delays corresponding to t times each integral power of two from 0 to N−1; and selecting means (12,22, . . . ,82) having two inputs, for selecting as an output of a particular stage either the input or the output of that stage's delay element, so that by suitable control of the signal selecting means any combination of delays from 0 to $(2^N-1)*t$ may be obtained;

and the programmable variable delay circuit further comprising N-bits of delay selection signals, with the delay selection signals being connected to the selecting means of the plurality of delay stages such that less significant bits are connected to selection means associated with shorter delays and more significant bits are connected to selection means associated with longer delays in a monotonic correspondence, so that digital values applied to the delay selection signals produce proportional cumulative delays from the variable delays circuit.

* * * * *